(12) United States Patent
Cloos et al.

(10) Patent No.: US 10,185,010 B2
(45) Date of Patent: Jan. 22, 2019

(54) RAPID 3D VOLUMETRIC MAPPING OF MRI RELAXATION PARAMETERS

(71) Applicant: NEW YORK UNIVERSITY, New York, NY (US)

(72) Inventors: Martijn Anton Hendrik Cloos, Long Island City, NY (US); Riccardo Lattanzi, New York, NY (US)

(73) Assignee: NEW YORK UNIVERSITY, New York, NY (US)

( * ) Notice: Subject to any disclaimer, the term of this patent is extended or adjusted under 35 U.S.C. 154(b) by 364 days.

(21) Appl. No.: 15/061,863

(22) Filed: Mar. 4, 2016

(65) Prior Publication Data
US 2016/0260243 A1 Sep. 8, 2016

Related U.S. Application Data

(60) Provisional application No. 62/129,597, filed on Mar. 6, 2015.

(51) Int. Cl.
| | |
|---|---|
| *G06K 9/00* | (2006.01) |
| *G01R 33/56* | (2006.01) |
| *G01R 33/50* | (2006.01) |
| *G01R 33/561* | (2006.01) |

(52) U.S. Cl.
CPC .......... *G01R 33/5602* (2013.01); *G01R 33/50* (2013.01); *G01R 33/5613* (2013.01)

(58) Field of Classification Search
CPC . G01R 33/5602; G01R 33/5613; G01R 33/50
USPC ................................. 382/128–134
See application file for complete search history.

(56) References Cited

U.S. PATENT DOCUMENTS

| | | | | |
|---|---|---|---|---|
| 4,920,314 A * | 4/1990 | Satoh | ............... | G01R 33/482 324/309 |
| 4,928,063 A * | 5/1990 | Lampman | ............ | G01R 33/20 324/307 |
| 5,227,728 A * | 7/1993 | Kaufman | ............... | G01V 3/00 324/322 |
| 5,307,014 A * | 4/1994 | Laub | ................ | G01R 33/563 324/306 |
| 5,726,569 A * | 3/1998 | Krieg | ............... | G01V 3/14 324/309 |
| 6,028,428 A * | 2/2000 | Cunningham | ....... | G01R 33/446 324/307 |
| 2013/0285664 A1* | 10/2013 | Scheel | ............... | G01R 33/3852 324/319 |

(Continued)

*Primary Examiner* — Andrew Moyer
(74) *Attorney, Agent, or Firm* — Foley & Lardner LLP

(57) ABSTRACT

Systems and methods are disclosed for pseudo steady state magnetic resonance fingerprinting. A representative system includes a magnetic resonance control unit. Radio frequency energy is directed in a sequence to a volume. The sequence includes at least two segments. Each segment contains a series of radio frequency pulse which may be used in concert with a series of gradient waveforms. The first segment is repeated successively until magnetization at a beginning of the segment is stable. This initial magnetization deviates from the equilibrium magnetization. Subsequently, the magnetic resonance control unit produces a plurality of imaging segments which collectively capture a high resolution 3D data set, which encodes at least one relaxation parameter into a MR fingerprint. A short delay time may be inserted between imaging sequences.

32 Claims, 4 Drawing Sheets

(56) References Cited

U.S. PATENT DOCUMENTS

2016/0116559 A1* 4/2016 Cohen .................. G01R 33/561
                                                        324/309
2017/0332981 A1* 11/2017 Witschey ............. A61B 5/7289

* cited by examiner

RAPID 3D VOLUMETRIC MAPPING OF MRI RELAXATION PARAMETERS

CROSS-REFERENCE TO RELATED PATENT APPLICATIONS

This application claims priority from Provisional Application U.S. Application 62/129,597, filed Mar. 6, 2015, incorporated herein by reference in its entirety.

FIELD

The present invention generally relates to magnetic resonance imaging.

BACKGROUND

Traditional quantitative Magnetic Resonance Imaging (MRI) methods suffer from prolonged scan times as well as experimental imperfections. These shortcomings have hindered the clinical adoption of these techniques. Magnetic Resonance Fingerprinting (MRF), on the other hand, is a more recent approach to data acquisition, post-processing, and visualization. MRF involves constructing quantitative parameter maps from a time-series of highly under-sampled images. When using a suitable sequence, the images acquired collectively reflect a time dependent spin evolution, which can identify underlying tissue properties in each voxel.

SUMMARY

In brief, MRF is divided into three steps: pre-processing, measurement, and post-processing. The pre-processing step is performed only once and entails the simulation of the spin dynamics induced by a sequence of radiofrequency (RF) and magnetic gradient pulses. This process is repeated for a plethora of tissue specific parameters. Combined, these simulations form a dictionary that links different tissue parameters to a specific spin evolution. Unlike pre-processing, measurement and post-processing are performed repeatedly. During measurement, a subject is exposed to the sequence of RF and gradient pulse during which a series of Magnetic Resonance (MR) images is collected. The final stage combines all of these images into a time series of signals for each voxel. These signals are then correlated with the simulated spin evolutions in the dictionary. The dictionary entry that best matches the measured signal is used to identify the underlying tissue properties.

Although MRF permits the reconstruction of multiple parameters from one single, relatively quick MR acquisition, MRF has certain deficiencies. For example, sub-millimeter isotropic multi-parametric mapping is still not clinically feasible with MRF. The benefits of sub-millimeter isotropic multi-parametric mapping include the capability to re-format a volumetric dataset along any given orientation. Such a capability allows for detection of small, isolated lesions and for tracking the full extent of large lesions. Additionally, sub-millimeter isotropic multi-parametric mapping permits minimization of partial volume averaging.

Three-dimensional (3D) mapping based on the MRF approach is not clinically feasible at least because it does not permit sub-millimeter isotropic multi-parametric mapping within a clinically acceptable scan time. The current two-dimensional (2D) MRF approach permits capturing a data set with a high in-plane resolution in one single continues acquisition (i.e., a 'single shot'). However, a direct generalization of the MRF method to a three-dimensional (3D) volume is not possible. In particular, unlike 2D MRF, it is not possible to capture sufficient data in one single shot to reconstruct high-resolution 3D data.

When using multiple shots to capture the 3D dataset, a bottleneck is formed, which can dramatically lengthen acquisition time. In a multi-shot 3D MRF sequence, each shot must be followed by a delay time during which all spins can relax back to equilibrium. For a typically longitudinal relaxation (T1) time of 2 seconds, each shot may be delayed by about 5×T1=10 seconds. These individual delays between shots accrue to contribute to the overall long scan time. Consider, for example, a 1 mm isotropic spatial resolution brain dataset of 256×256×180 voxels. If we assume that 256 shots would be sufficient—more than three times the acceleration currently demonstrated in MRF—the cumulative dead time would be 256×10 s≈43 min, or roughly five times the clinically acceptable scan time of 9 minutes.

A pseudo-steady-state (pss) MRF approach differs from prior approaches to rapid multi-parametric mapping based on MRF and achieves sequence durations within clinically acceptable scan times. The pss MRF approach allows for 3D mapping of relaxation parameters without the bottlenecks noted above. The pss MRF approach of the present disclosure is described herein with reference to various non-limiting embodiments summarized below.

In one embodiment, a system for pseudo steady state magnetic resonance fingerprinting comprises an emitter and a magnetic resonance control unit. The emitter is configured to direct pulses of radio frequency energy to a volume. The sequence of pulses can be divided into a perpetration segment and imaging segment. The emitter is further configured to repeat the first segment (the perpetration segment) successively until the initial magnetization at a beginning of segment has stabilized. The new initial magnetization deviates substantially from the equilibrium magnetization. Once the initial magnetization has stabilized, the magnetic resonance control unit is configured to concatenate a plurality of imaging segments. Each image segment equates to a single shot. Collectively, these imaging segments accrue to a high-resolution 3D dataset, which encodes at least one relaxation parameter into an MR fingerprint.

In a further embodiment, a non-transitory computer-readable memory has instructions stored thereon. Instructions are provided for applying a sequence of radio frequency energy pulses to a volume. This sequence includes at least two stages. During the first stage, further instructions are provided for repeating a fixed sub-sequence of radio frequency pulses (a segment) until the magnetization at a beginning of the segment is stable. The initial magnetization deviates from the equilibrium magnetization. Further instructions are provided for concatenating a plurality of imaging segments to encode at least one relaxation parameter into a MR fingerprint during the second stage.

In such embodiments, a small delay time (e.g., <5×T1) may be inserted between imaging segments. This delay time serves to help encode T1 relaxation. Further, the delay time may be used to help time the initial magnetization in balancing tradeoffs between SNR, T1 encoding, and speed. As with other embodiments described herein, the initial magnetization at the beginning of each block may deviate from equilibrium.

Additional features, advantages, and embodiments of the present disclosure are apparent from consideration of the following detailed description, drawings, and claims. Moreover, it is to be understood that both the foregoing summary of the present disclosure and the following detailed description are exemplary and intended to provide further explanation without limiting the scope of the present disclosure and the claims.

BRIEF DESCRIPTION OF THE DRAWINGS

The foregoing and other objects, aspects, features, and advantages of the disclosure will become more apparent and better understood by referring to the following description taken in conjunction with the accompanying drawings, in which.

DETAILED DESCRIPTION

Figure 1:
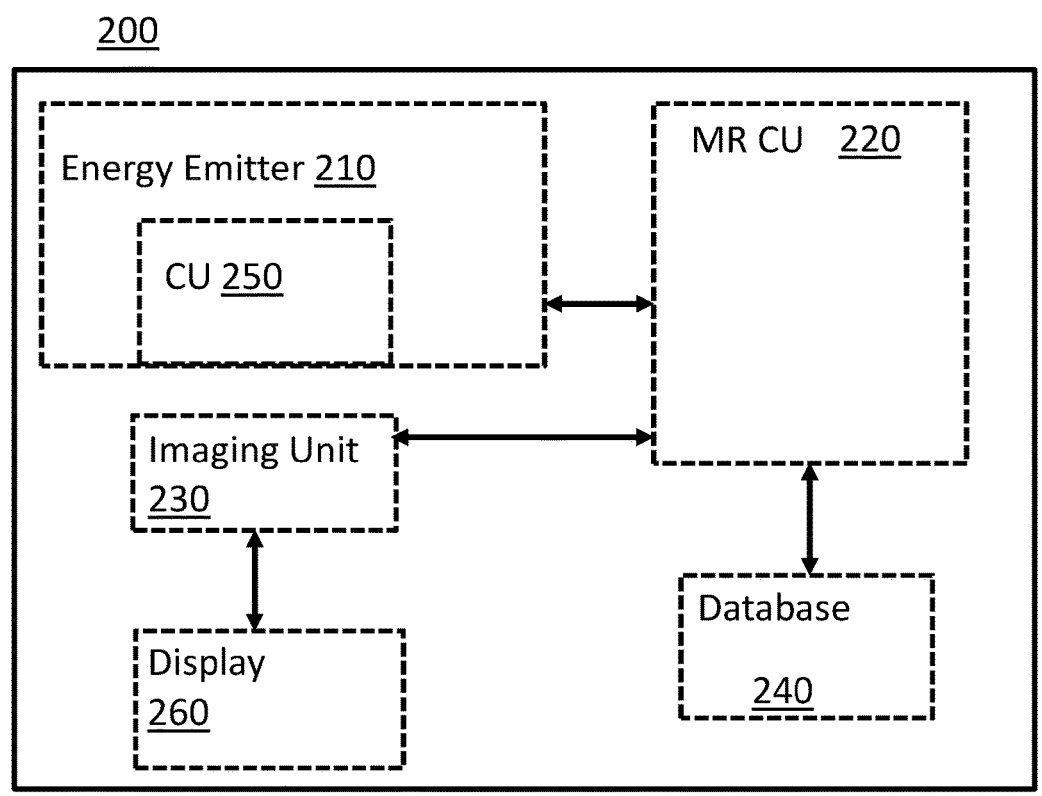
FIG. 1 illustrates an apparatus for pseudo steady-state magnetic resonance fingerprinting according to an implementation.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

As summarized above, a pss MRF approach allows for rapid 3D mapping of relaxation parameters such that an entire sequence can be performed within a clinically acceptable scan time. The pss MRF approach may include a preparation stage. This preparation stage may contain one or more preparation segments. For example, during the preparation stage, a preparation segment may be repeated $\Gamma$ times until the magnetization at the beginning of the segment has stabilized. In accordance with design parameters, a single preparation segment may be sufficient in some implementations. However, in many cases several repetitions (e.g., 2-10) may be employed.

Next, upon finishing the preparation stage, a rapid concatenation of imaging segments takes place. Here, the term 'rapid' indicates that the time between imaging segments is significantly shorter than 5×T1 for the T1 time of the sample. In other words, the longitudinal relaxation is not allowed to recover back to equilibrium. Such an approach allows for directly concatenation of the repeated imaging segments into one continuous acquisition without delay.

In at least one embodiment, a preparation segment contains a sequence of two or more RF excitations. Likewise, an imaging segment also contains two or more RF excitations. The sequence of RF excitations can be the same in both preparation and imaging segments. However, during the preparation stage, no data is recorded for the construction of MR fingerprints. Nevertheless, it is still possible to record data during the preparation stage for other purposes such as, for example, gradient eddy-current corrections. Each imaging segment can contain different imaging gradients to sample complementary regions of k-space.

The preparation stage serves to stabilize the initial magnetization at the beginning of each imaging segment. This way, the different imaging segments can add complementary spatial information to the MR fingerprint by sampling different regions of k-space. This circumvents the need to wait for the whole system of spins to relax back to equilibrium before the imaging segment can be repeated.

In addition, the preparation stage can provide a set of coherence pathways at the start of the imaging segment. Further, the gradient spoiled transverse magnetization ($M_{xy}$) can be refocused. In the extended phase graph (EPG) formulism, the spoiled $M_{xy}$ is distributed over one or more coherence pathways, each of which can be refocused at different time points following a train of RF excitations. This provides at least two benefits. Firstly, the ability to refocus existing coherence pathways adds an additional signal in to the fingerprint. This way, although $M_{z0}<M_0$, a high signal level can be maintained. Secondly, this additional signal helps encode the transverse relaxation (T2) constant into the MR fingerprint. In particular, each of these coherence pathways is attenuated by T2 relaxation. That is, in some implementations, one or more 'crusher' gradients may be used to reset or partially destroy the existing coherence pathways. In other words, the natural decays of the refocused signal contributions in the imaging segment are proportional to T2. Further, the phase of the radiofrequency fields may be altered between one or more pulses to reset or partially destroy existing coherence pathways.

Once the delay time complication is overcome, volume-selective square radiofrequency (RF) pulses can be used. Such pulses can be as short as 0.1 ms. Compared to the ~2 ms selective pulses used in 2D MRF, the inter-echo time can be reduced substantially. For example, in some instances, the average inter-echo time may be reduced from 5 ms to approximately 3 ms.

Shorter pulses not only allow a higher sampling rate, but also enhance the encoding of magnetization transfer (MT) effects into the fingerprint. MT contrast provides information about protons bound to macromolecules such as proteins. Due to their local environment, the T2 relaxation of these bound protons is so short (T2<1 ms) that their MR signal cannot be observed directly. However, because the $M_{xy}$ of the bound protons stored in separate coherence pathways are cannot be refocused before T2 relaxation effects have destroyed their coherence, their longitudinal magnetization evolves differently from the free protons. Nevertheless, these two groups of protons exchange magnetization. This couples their dynamics and allows the effects from the pound protons to be encoded into the free protons (water) MR fingerprint.

In some implementations, a pss MRF approach may reduce acquisition time by nearly one order of magnitude. For example, if a 1 mm isotropic spatial resolution is targeted for a 256×256×180 voxel brain dataset, then the total cumulative dead time would be approximately 2.6 minutes, whereas 3D MRF may be expected to take about 26 minutes. The shorter acquisition times of the pss MRF technique thus allow 3D high resolution multi-parametric mapping of MRI relaxation parameters in vivo, well within clinically feasible scan times.

The following discussion details several exemplary implementations of pss MRF. The techniques of the present disclosure detailed herein are not limited to the applications discussed below. Further, it should be understood that a large number of techniques exist for the formation of MR signals. Any number of these, in various combinations, may be used throughout each preparation or imaging segment.

In one implementation, a pss MRF approach may be used to simultaneously quantify, in a non-invasive manner, multiple biochemical parameters (e.g., T1, T2, MT and T2*) in articular cartilage. Advantageously, such an approach may be applied for early detection of lesions in the cartilage which, if left untreated, may lead to osteoarthritis. The pss MRF approach may also be used for diagnosis and monitoring of treatment. Further, the pss MRF approach may aid in chondroprotection, i.e., the measures to prevent, delay or repair degenerative joint injuries. For example, performing early detection with pss MRF may increase the likelihood that certain chondroprotective agents and techniques will be efficacious, because such measures are generally more helpful if taken prior to the destruction of the solid cartilage matrix.

In another implementation, a pss MRF approach is employed in quantitative brain imaging. The pss MRF approach may be used in lieu of multiple qualitative volumetric strategies, replacing these strategies with one fast, high-resolution multi-parametric mapping acquisition. For example, such an approach may aid the identification of multiple sclerosis lesions. Additionally, employing a pss MRF approach may improve the accuracy and robustness of automated tissue segmentation. Accordingly, the reliability of volumetric quantifications of brain atrophy may also be improved. Similarly, the improved accuracy and robustness of automated tissue segmentation with the pss MRF approach may correspond to enhancements in the assessment of localized cortical thinning and the quantification of the gray/white matter fractions.

In a further implementation, the pss MRF approach may be used with parallel transmission of data for accelerated acquisition. Techniques involving parallel transmission are described in M. Cloos, C. Wiggins, G. Wiggins, and D. Sodickson, "Plug and Play Parallel Transmission at 7 and 9.4 Tesla based on Principles from MR Fingerprinting," Proc. Int. Soc. Mag. Reson. Med. 22 (2014) 0542 and U.S. Patent Application Ser. No. 61/904,716 to M. Cloos, filed on Nov. 15, 2013, entitled "Self Calibrating Parallel Transmission by Spin Dynamic Fingerprinting," which are incorporated herein by reference in their entirety for background information and the devices, systems, processes and techniques disclosed therein. By employing a pss MRF approach in a framework for signal encoding with simultaneous transmission, the acquisition time can be sped up to further reduce an overall examination duration and improve the fidelity of a final image/parameter map per unit scan time. Additionally, employing the pss MRF approach and parallel transmission in tandem melds an image acquisition approach and a calibration procedure together. Such an integrated approach may permit simultaneous estimation of multiple transmit-sensitivity profiles, among other things.

Further implementations may include using pss MRF approaches to perform quantitative mapping of MRI parameters in any region of the body. Furthermore, given the reduction in acquisition time, the pss MRF approach may facilitate the construction of an extensive, system-independent multi-paratactic database to be used in improving detection, identification and classification of pathologies.

One embodiment relates to an apparatus for pss MRI. FIG. 1 depicts a system 200 comprising at least one component configured to carry out pss MRI. As shown in FIG. 1, the system 200 includes a device 210 configured to apply RF energy to a volume of an object (a volume, for example, in a human or animal body), and a magnetic resonance control unit 220. The system 200 may optionally include an imaging unit 230, a display 260, and a database 240.

Referring again to FIG. 1, the device 210 may be an energy emitter such as a magnetic resonance imaging apparatus that emits RF energy. The device 210 may, in some implementations, include a control unit 250 containing control logic for controlling various aspects of the emission of energy from the emitter 210. In some implementations, the device 210 does not rely on the control unit 250, and is instead controlled by the magnetic resonance control unit 220. In other implementations, the control unit 250 of the device 210 is configured to communicate with the magnetic resonance control unit 220. The device 210 is configured to emit energy to the volume in multiple sequence blocks or segments. The sequence blocks may include multiple stages, for example, a preparation stage, a delay stage, and an acquisition stage.

Referring once more to FIG. 1, the magnetic resonance control unit 220 is a controller that is configured to communicate with the emitter 210 to control the application of energy to the volume. For example, the magnetic resonance control unit 220 may be configured to command the emitter 210 to provide pulses of energy with fixed or variable characteristics. The magnetic resonance control unit 220 may control the emitter 210 such that the aforementioned preparation stage is repeated until the magnetization at the beginning of a sequence block has stabilized. The number of repetitions may be r repetitions, where Γ may be determined empirically, experimentally, or based on simulation data.

Furthermore, the control unit 220 shown in FIG. 1 may be configured to produce a plurality of imaging segments corresponding to the plurality of sequence blocks. The control unit 220 may cooperate with an imaging unit 230 to produce the imaging segments. In some instances, the imaging unit 230 may be integrated within the control unit 220, while in other implementations, the imaging unit 230 may be physically separated and distinct from the control unit 220. In some implementations, the imaging unit 230 may be coupled to a display 260 that may provide information about the imaging. The display 260 may allow, via touch-screen capability, manipulation of the control unit 220 and/or the imaging unit 230.

Still in reference to FIG. 1, the control unit 220 may be further configured to concatenate the plurality of imaging segments into a single continuous imaging segment. The singe continuous imaging segment thus contains the information gathered in each of the individual imaging segments. The control unit 220 may concatenate the plurality of imaging segments rapidly such that the concatenation is complete within a given predetermined time period. The predetermined time period may be a threshold time after which the concatenation is determined to 'time out.' If the concatenation is determined not to have been completed within the threshold time, then the control unit 220 may perform troubleshooting or an error correction procedure and then attempt the concatenation once again.

Additionally, the control unit 220 is configured such that at least one relaxation parameter is encoded into the MR fingerprint. For example, both T1 and T2 relaxation parameters may be encoded. Due to the repetition of the preparation stage and the rapid concatenation, fingerprints may be obtained throughout a 3D volume in a relatively short period of time. This short period of time may fall within clinically acceptable scan times for a variety of scans (e.g., cartilage scans, brain scans).

As described above, the control unit 220 may be configured to control a variety of aspects of the emitter 210, and may determine how the energy is applied to the volume. For example, the control unit 220 may command the emitter 210 to deliver sequences of square radio frequency pulses. In one implementation, the emitter 210 delivers a pulse sequence of a square radio frequency pulse of 0.1 ms. The control unit 220 may also employ spatially selective pulses to excite a slab or a 3D sub volume of interest.

Furthermore, in some implementations, the control unit 220 is further configured to recycle a fraction of transverse magnetization induced by preceding sequence blocks. Thus, although the relationship Mz0<M0 may hold, a high signal level can nevertheless be maintained. The precise fraction depends strongly on the T2 decay time of the tissues involved. Consequently, this mechanism also helps encode T2 in the MR fingerprint.

Referring yet again to FIG. 1, the control unit 220 may be configured to control the pulse sequence to incorporate aspects of FISP techniques. More specifically, the control unit 220 may employ the FISP technique of using unbalanced gradient moments to control against $B_0$ inhomogeneities. The FISP sequence, in some implementations, may combine both a refocused echo and a free induction decay echo such that the resulting fingerprints reflect both T1 and T2 relaxation effects. Furthermore, the control unit 220 may vary an echo time TE between imaging blocks such that the free induction decay echo is sensitized to T2* variations. In this manner, the control unit 220 permits simultaneous quantification of volume characteristics.

Referring once more to FIG. 1, the control unit 220 may be configured to communicate with a database 240. The database 240 may be in an external computing device (not shown) or may be integrated within the control unit 220 or the imaging unit 230. The database 240 may store data relating to each acquired fingerprint. The database 240 may facilitate comparison of data acquired in a scan to entries in the database 240. In some implementations, the database 240 may be remotely connected to the control unit 220. The database 240 may be a multi-paratactic database that aids in detection, identification, and classification of pathologies.

Figure 2:
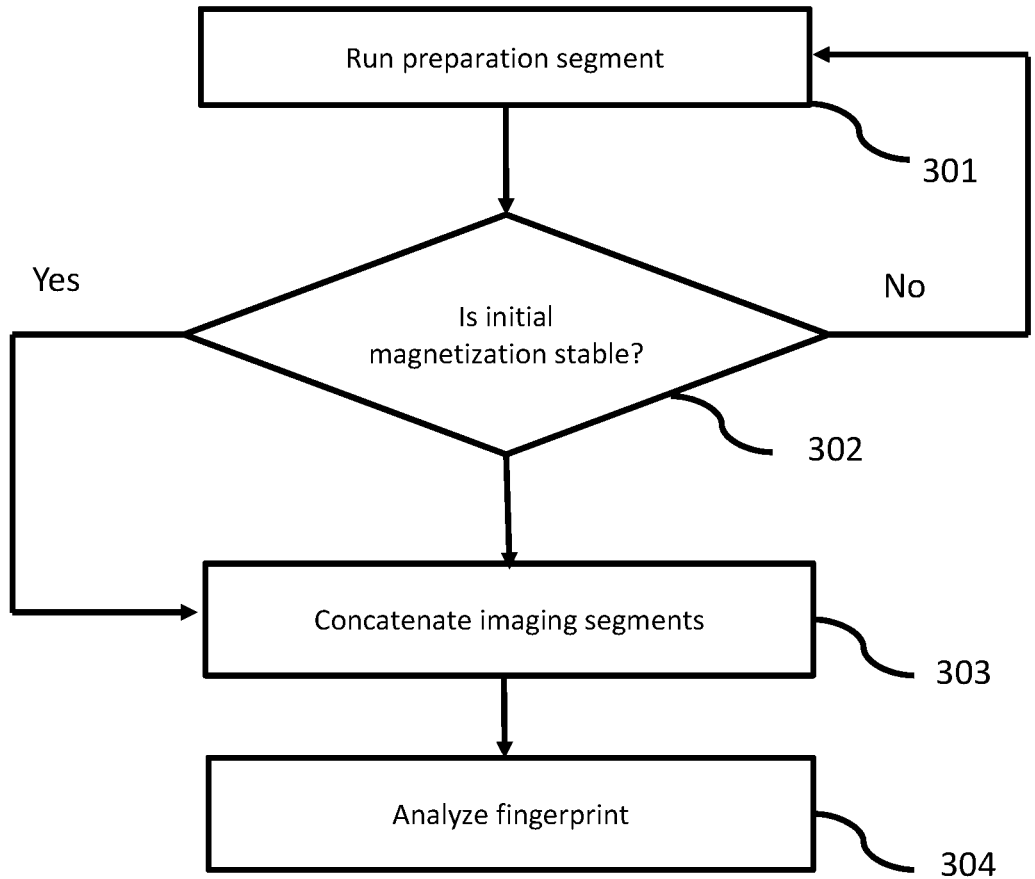
FIG. 2 illustrates a process for pseudo steady-state magnetic resonance fingerprinting according to an implementation.

Other embodiments relate to methods for pseudo steady-state MRF. FIG. 2 illustrates an embodiment relating to a method 300 for pseudo steady state magnetic resonance fingerprinting. The method 300 may be implemented by a system such as the system 200 described above. The method 300 includes applying energy to a volume that may be a volume in a human or animal body during the preparation and imaging segments. The application of energy may include applying RF energy in square pulse waves of 0.1 ms, for example, in a plurality of sequence blocks. The method 300 includes performing a first stage that may be a preparation stage (301). Other stages may include, by way of example, a waiting stage and an acquisition stage when data is acquired for a scan.

Referring again to FIG. 2, following an initial performance of the first stage (301), the method 300 further includes making a determination (302) as to whether the first stage should be repeated. More specifically, the determination (302) involves an inquiry to decide whether the magnetization at the beginning of a sequence block is stable. If the magnetization is determined to be unstable, then the first stage (301) is repeated. The number of repetitions can be determined empirically, experimentally, or based on simulation data. On the other hand, if the magnetization is stable, then the concatenation of imaging segments is started. The first stage is relatively short, typically far less than a tenth of the total scan time, and so the time between the initial performance of the first stage and the stabilization of magnetization at the beginning of the block is not unduly long.

With reference again to FIG. 2, the method 300 also includes, once the magnetization is stable, rapidly concatenating imaging segments corresponding to the sequence blocks (303). In some implementations, the concatenation (303) may be required to be completed within a predetermined time period. As described above in the context of FIG. 1, the concatenation of individual imaging segments results in the formation of a single MR fingerprint per voxel. Thus, the concatenation (303) allows for a single fingerprint to be acquired efficiently. The measured MR fingerprint encodes at least one relaxation parameter. By way of example, a single fingerprint may identify both T1 and T2. Once the fingerprint is produced, the method 300 includes analyzing the fingerprint (304). The analysis may be undertaken for detection, diagnosis, and prognostic purposes, among others.

In some implementations, the method 300 further includes providing a fixed set of multiple coherence pathways at the beginning of each imaging segment. In some implementations, the method 300 further includes recycling a fraction of transverse magnetization induced by preceding sequence blocks. This can be achieved by refocusing the spoiled transverse magnetization. For example, among other techniques, this can be achieved by incorporating principles from FISP into the pulse sequence approach.

Figure 3:
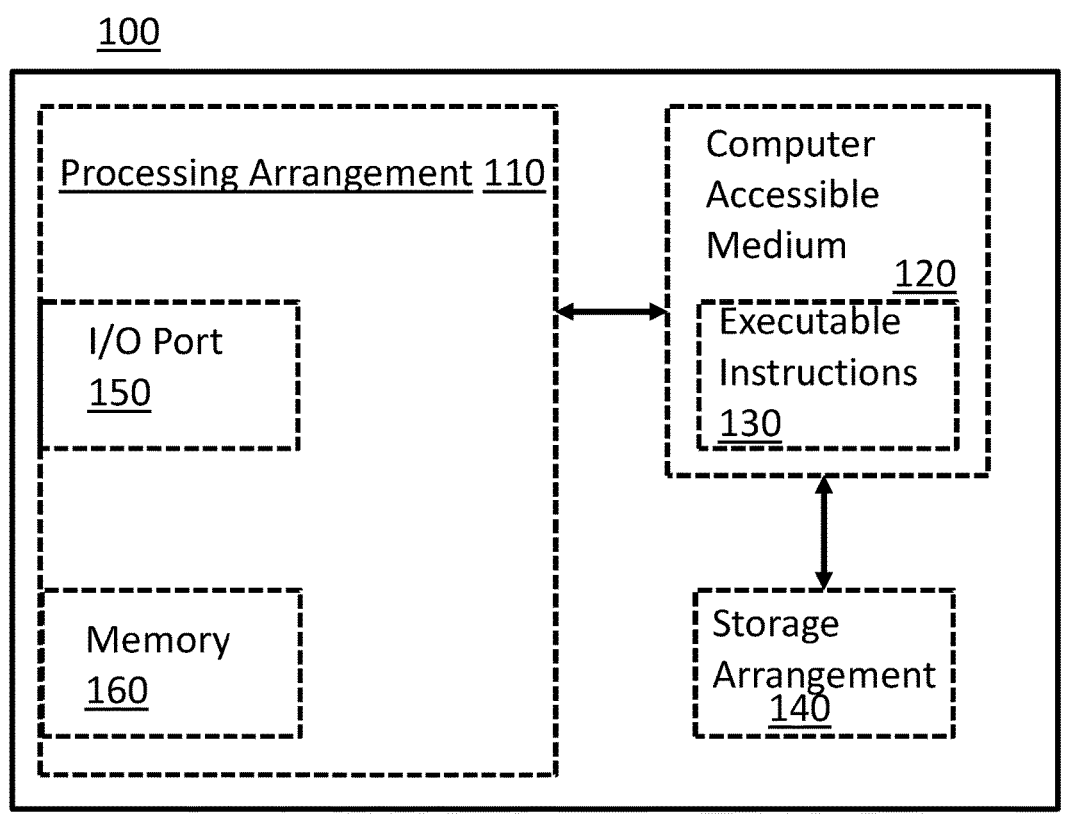
FIG. 3 illustrates a computer system for pseudo steady-state magnetic resonance fingerprinting according to an implementation.
Figure 4:
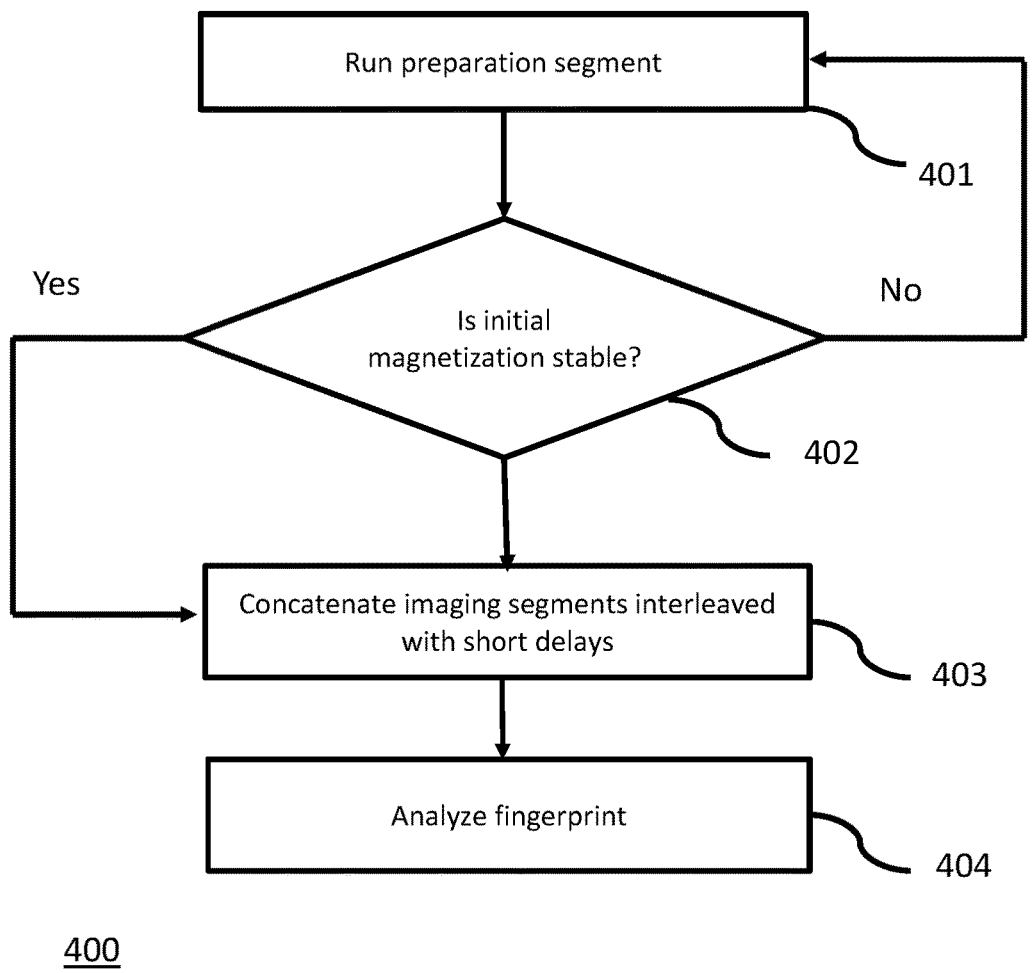
FIG. 4 illustrates a process for pseudo steady-state magnetic resonance fingerprinting according to an implementation.

FIG. 4 illustrates an embodiment relating to a method 400 for pseudo steady state magnetic resonance fingerprinting. The method 400 may be implemented by a system such as the system 200 described above. The method 400 is akin to method 300 described above, but may differ at least in regard to concatenation operations as described below. The method 400 includes the application of energy may include applying RF energy in square pulse waves of 0.1 ms, for example, in a plurality of sequence blocks. The method 400 includes performing a first stage that is a preparation stage (401), and then determining whether an initial magnetization is stable (402), in the manner described above with respect to method 300. The method further includes concatenating imaging segments that are interleaved with short delays (403). The short delay time may be inserted between imaging sequences to balance the signal to noise ratio, contrast to noise, and acquisition time. Following concatenation, the method further includes fingerprint analysis (404) as described above in regard to FIG. 3.

One embodiment relates to a system for magnetic resonance fingerprinting comprising a processor and a tangible computer-readable medium operatively connected to the processor. The system is configured to construct an extensive system-independent multi-paratactic database based on a plurality of acquisitions performed based on the above-described techniques.

As shown in FIG. 3, e.g., a computer-accessible medium 120 (e.g., as described herein, a storage device such as a hard disk, floppy disk, memory stick, CD-ROM, RAM, ROM, etc., or a collection thereof) can be provided (e.g., in communication with the processing arrangement 110). The computer-accessible medium 120 may be a non-transitory computer-accessible medium. The computer-accessible medium 120 can contain executable instructions 130 thereon. In addition or alternatively, a storage arrangement 140 can be provided separately from the computer-accessible medium 120, which can provide the instructions to the processing arrangement 110 so as to configure the processing arrangement to execute certain exemplary procedures, processes and methods, as described herein, for example. The instructions may include a plurality of sets of instructions. For example, in some implementations, the instructions may include instructions for applying radio frequency energy in a plurality of sequence blocks to a volume, where each of the sequence blocks includes at least a first stage. Instructions may further be provided for repeating the first stage successively until magnetization at a beginning of each of the sequence blocks is stable, for concatenating a plurality of imaging segments, which correspond to the plurality of sequence blocks, into a single continuous imaging segment, and for encoding at least one relaxation parameter into the single continuous imaging segment.

System 100 may also include a display or output device, an input device such as a key-board, mouse, touch screen or other input device, and may be connected to additional systems via a logical network. Many of the embodiments described herein may be practiced in a networked environment using logical connections to one or more remote computers having processors. Logical connections may include a local area network (LAN) and a wide area network (WAN) that are presented here by way of example and not limitation. Such networking environments are commonplace in office-wide or enterprise-wide computer networks, intranets and the Internet and may use a wide variety of different communication protocols. Those skilled in the art can appreciate that such network computing environments can typically encompass many types of computer system configurations, including personal computers, hand-held devices, multi-processor systems, microprocessor-based or programmable consumer electronics, network PCs, minicomputers, mainframe computers, and the like. Embodiments of the invention may also be practiced in distributed computing environments where tasks are performed by local and remote processing devices that are linked (either by hardwired links, wireless links, or by a combination of hardwired or wireless links) through a communications network. In a distributed computing environment, program modules may be located in both local and remote memory storage devices.

Various embodiments are described in the general context of method steps, which may be implemented in one embodiment by a program product including computer-executable instructions, such as program code, executed by computers in networked environments. Generally, program modules include routines, programs, objects, components, data structures, etc. that perform particular tasks or implement particular abstract data types. Computer-executable instructions, associated data structures, and program modules represent examples of program code for executing steps of the methods disclosed herein. The particular sequence of such executable instructions or associated data structures represents examples of corresponding acts for implementing the functions described in such steps.

Software and web implementations of the present disclosure may be accomplished with standard programming techniques with rule based logic and other logic to accomplish the various database searching steps, correlation steps, comparison steps and decision steps. It should also be noted that the words "component" and "module," as may be used herein and in the claims, are intended to encompass implementations using one or more lines of software code, and/or hardware implementations, and/or equipment for receiving manual inputs.

With respect to the use of substantially any plural and/or singular terms herein, those having skill in the art can translate from the plural to the singular and/or from the singular to the plural as is appropriate to the context and/or application. The various singular/plural permutations may be expressly set forth herein for the sake of clarity.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. Therefore, the above embodiments should not be taken as limiting the scope of the invention.

What is claimed is:

1. A method for pseudo steady state magnetic resonance fingerprinting, comprising:
   preparing a single continuous imaging segment by repeating a plurality of imaging segments;
   concatenating the plurality of imaging segments to form the single continuous imaging segment, and
   encoding at least one relaxation parameter into the single continuous imaging segment,
   wherein, at a beginning of each of the plurality of imaging segments, an available magnetization of magnetic resonance visible free protons and magnetic resonance invisible bound protons are stabilized to different fractions of their respective equilibrium values.

2. The method of claim 1, wherein a sequence of at least two radiofrequency pulses is performed during each of the preparation, the concatenation, and the encoding.

3. The method of claim 1, further comprising:
   stabilizing an initial magnetization following the preparation of the single continuous imaging segment.

4. The method of claim 3, wherein the initial magnetization is smaller than an equilibrium magnetization.

5. The method of claim 1, further comprising using each of the plurality of imaging segments to measure a magnetic resonance fingerprinting dataset.

6. The method of claim 1, further comprising resetting or partially destroying existing coherence pathways via at least one crusher gradient.

7. The method of claim 1, further comprising altering a phase of a radiofrequency field between one or more pulses to reset or partially destroy existing coherence pathways.

8. The method of claim 1, further comprising resetting or partially destroying existing coherence pathways using at least one crusher gradient and by altering a phase of a radiofrequency field.

9. The method of claim 1, wherein each of the plurality of imaging segments samples a complementary part of k-space such that each additional imaging segment adds new spatial information.

10. The method of claim 1, wherein each of the plurality of imaging segments are separated by a delay time shorter than five times a T1 time of a sample, such that an initial magnetization at a beginning of each imaging segment is less than an equilibrium magnetization.

11. The method of claim 1, wherein:
    the imaging segments are not separated by a delay time.

12. The method of claim 1, wherein:
    preparing the single continuous imaging segment further comprises acquiring gradient eddy current calibration data.

13. The method of claim 1, wherein:
    data is acquired during preparation which is not part of the continuous imaging segment.

14. The method of claim 1, wherein following the preparation, coherence pathways are stabilized such that at the beginning of each imaging segment, a transverse magnetization is distributed over available pathways.

15. A system for pseudo steady state magnetic resonance fingerprinting, comprising:
a radio frequency emitter configured to direct radio frequency energy to a volume, and
a magnetic resonance controller configured to
repeat a plurality of imaging segments;
concatenate the plurality of imaging segments to form a single continuous imaging segment, and
encode at least one relaxation parameter into the single continuous imaging segment,
wherein, at a beginning of each of the plurality of imaging segments, an available magnetization of magnetic resonance visible free protons and magnetic resonance invisible bound protons are stabilized to different fractions of their respective equilibrium values.

16. The system of claim 15, wherein the magnetic resonance controller is configured to stabilize an initial magnetization prior to concatenation of the plurality of imaging segments.

17. The system of claim 15, wherein the magnetic resonance controller is configured to reset or partially destroy existing coherence pathways.

18. The system of claim 15, wherein each of the plurality of imaging segments is separated by a delay time such that an initial magnetization at a beginning of each segment is less than an equilibrium magnetization.

19. The system of claim 17, wherein the magnetic resonance controller is configured to reset or partially destroy the existing coherence pathways via at least one of a crusher gradient and a phase alteration of a radiofrequency field.

20. A non-transitory computer-readable memory having instructions thereon, the instructions comprising:
instructions for preparing a single continuous imaging segment by repeating a plurality of imaging segments;
instructions for concatenating the plurality of imaging segments to form the single continuous imaging segment,
instructions for encoding at least one relaxation parameter into the single continuous imaging segment, and
instructions for stabilizing, at a beginning of each of the plurality of imaging segments, an available magnetization of magnetic resonance visible free protons and magnetic resonance invisible bound protons to different fractions of their respective equilibrium values.

21. The non-transitory computer-readable memory of claim 20, further comprising:
instructions for stabilizing an initial magnetization following the preparation of the single continuous imaging segment.

22. The non-transitory computer-readable memory of claim 21, wherein the initial magnetization is smaller than an equilibrium magnetization.

23. The non-transitory computer-readable memory of claim 20, further comprising instructions for using each of the plurality of imaging segments to measure a magnetic resonance fingerprinting dataset.

24. The non-transitory computer-readable memory of claim 20, wherein a sequence of at least two radiofrequency pulses is performed during each of the preparation, the concatenation, and the encoding.

25. The non-transitory computer-readable memory of claim 20, further comprising instructions for resetting or partially destroying existing coherence pathways via at least one crusher gradient.

26. The non-transitory computer-readable memory of claim 20, further comprising instructions for altering a phase of a radiofrequency field between one or more pulses to reset or partially destroy existing coherence pathways.

27. The non-transitory computer-readable memory of claim 20, wherein each of the plurality of imaging segments samples a complementary part of k-space such that each additional imaging segment adds new spatial information.

28. The non-transitory computer-readable memory of claim 20, wherein each of the plurality of imaging segments are separated by a delay time shorter than five times a T1 time of a sample, such that an initial magnetization at a beginning of each imaging segment is less than an equilibrium magnetization.

29. The non-transitory computer-readable memory of claim 20, wherein the imaging segments are not separated by a delay time.

30. The non-transitory computer-readable memory of claim 20, wherein preparing the single continuous imaging segment further comprises acquiring gradient eddy current calibration data.

31. The non-transitory computer-readable memory of claim 20, further comprising instructions for acquiring data during preparation, which data is not part of the at least one continuous imaging segment.

32. The non-transitory computer-readable memory of claim 20, wherein following the preparation, coherence pathways are stabilized such that at the beginning of each imaging segment, a transverse magnetization is distributed over available pathways.

* * * * *

UNITED STATES PATENT AND TRADEMARK OFFICE
CERTIFICATE OF CORRECTION

PATENT NO. : 10,185,010 B2  
APPLICATION NO. : 15/061863  
DATED : January 22, 2019  
INVENTOR(S) : Martijn Anton Hendrik Cloos and Riccardo Lattanzi Page 1 of 1

It is certified that error appears in the above-identified patent and that said Letters Patent is hereby corrected as shown below:

In the Specification

Column 1, Line 11 following after the "Cross Reference to Related Applications", add new sub-heading and paragraph:
"STATEMENT OF GOVERNMENT INTEREST
This invention was made with government support under grant numbers EB020096 and AR070297 awarded by the National Institutes of Health. The government has certain rights in the invention."

Signed and Sealed this  
First Day of April, 2025

Coke Morgan Stewart  
*Acting Director of the United States Patent and Trademark Office*